United States Patent
Lin et al.

(10) Patent No.: US 10,795,063 B2
(45) Date of Patent: Oct. 6, 2020

(54) TRANSFLECTIVE AND NON-RECTANGULAR DISPLAY PANEL AND DISPLAY DEVICE

(71) Applicant: SHANGHAI TIANMA MICRO-ELECTRONICS CO., LTD., Shanghai (CN)

(72) Inventors: Baiquan Lin, Shanghai (CN); Kerui Xi, Shanghai (CN); Ming Xie, Shanghai (CN); Huanxi Zhang, Shanghai (CN); Min Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 168 days.

(21) Appl. No.: 16/174,312

(22) Filed: Oct. 30, 2018

(65) Prior Publication Data

US 2019/0064403 A1 Feb. 28, 2019

(30) Foreign Application Priority Data

Jan. 2, 2018 (CN) .......................... 2018 1 0001804

(51) Int. Cl.
*G02B 5/08* (2006.01)
*G02B 5/20* (2006.01)
*G02F 1/1335* (2006.01)
*H01L 27/32* (2006.01)

(52) U.S. Cl.
CPC ............... *G02B 5/08* (2013.01); *G02B 5/201* (2013.01); *G02F 1/133555* (2013.01); *G02F 1/133512* (2013.01); *G02F 1/133514* (2013.01); *G02F 2201/56* (2013.01); *H01L 27/322* (2013.01)

(58) Field of Classification Search
CPC ..... G02B 5/08; G02B 5/201; G02F 1/133512; G02F 1/133514; G02F 1/133555
USPC ................................. 359/839; 349/106, 110
See application file for complete search history.

(56) References Cited

U.S. PATENT DOCUMENTS

| | | | | |
|---|---|---|---|---|
| 10,288,927 | B2* | 5/2019 | Liu | G02F 1/133512 |
| 10,643,577 | B2* | 5/2020 | Nakamura | G09G 5/10 |
| 2009/0309813 | A1* | 12/2009 | Fujita | G02F 1/133512 |
| | | | | 345/55 |

(Continued)

FOREIGN PATENT DOCUMENTS

CN 106707606 A 5/2017

*Primary Examiner* — Ricky D Shafer
(74) *Attorney, Agent, or Firm* — Kilpatrick Townsend & Stockton, LLP (57) ABSTRACT

A transflective and non-rectangular display panel and a display device are provided. The non-rectangular display panel includes a display region, a non-display region surrounding the display region, multiple pixels including multiple sub pixels, and a light shielding layer. There is a first boundary between the display region and the non-display region, and a region surrounded by the first boundary and the display region is non-rectangular. Each of the multiple pixels includes at least three of the multiple sub pixels. An open region of each of the multiple sub pixels has a transmissive region and a reflective region. The multiple pixels include normal pixels in the display region and abnormal pixels passed through by the first boundary. In each of the abnormal pixels, each of the transmissive region and the reflective region is partially blocked by the light shielding layer and partially emits light therefrom.

13 Claims, 9 Drawing Sheets

(56) References Cited

U.S. PATENT DOCUMENTS

| | | | |
|---|---|---|---|
| 2010/0156950 A1* | 6/2010 | Pak | G02F 1/133514 345/690 |
| 2010/0289994 A1* | 11/2010 | Nonaka | G09G 3/20 349/108 |
| 2016/0291376 A1* | 10/2016 | Iwatsu | G02F 1/133512 |

* cited by examiner

Figure 1

PRIOR ART

Figure 2

PRIOR ART

TRANSFLECTIVE AND NON-RECTANGULAR DISPLAY PANEL AND DISPLAY DEVICE

CROSS REFERENCE OF RELATED APPLICATION

The present application claims priority to Chinese Patent Application No. 201810001804.1, titled "TRANSFLECTIVE AND NON-RECTANGULAR DISPLAY PANEL AND DISPLAY DEVICE", filed on Jan. 2, 2018 with the Chinese Patent office, which is incorporated herein by reference in its entirety.

FIELD

The present disclosure relates to the field of display, and particularly to a transflective and non-rectangular display panel and a display device.

BACKGROUND

With the continuous development of technology, more and more display devices are widely applied into people's daily life and work, which bring great convenience to people's daily life and work, and become an indispensable tool for people today.

An important display component of the display device achieving the display function is a display panel. The display panel includes a transmissive display panel, a reflective display panel and a transflective display panel according to different applications. As compared with the transmissive display panel and the reflective display panel, the transflective display panel can reflect light and has a backlight source. Under strong light, the backlight source may be turned off, and the transflective display panel operates in a reflective mode, to utilize reflected light. Under poor light, the backlight source may be turned on, and the transflective display panel operates in a transmissive mode. Therefore, the transflective display panel is mainly applied to a small or medium sized product such as a mobile phone, to meet a requirement for portability and energy-saving of the product.

Figure 1:
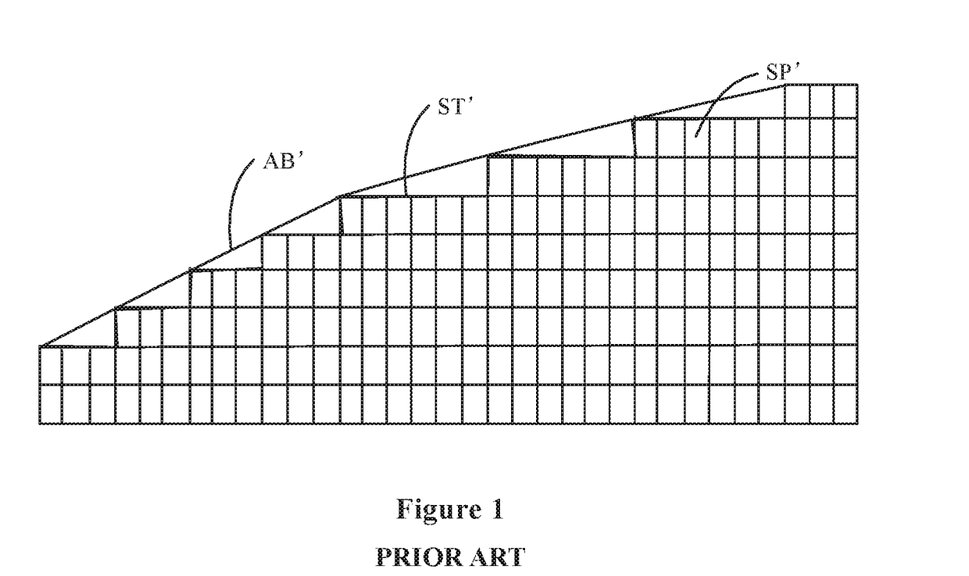
FIG. 1 is a schematic structural diagram of a non-rectangular display panel in the conventional technology.

Furthermore, non-rectangular display panels are developed with various requirements for shapes of the display panels. FIG. 1 shows a structure of a non-rectangular display panel in the conventional technology. The non-rectangular display panel differs from a conventional display panel mainly in that a display region of the non-rectangular display panel is in a non-rectangular shape such as a circle, a ring, a diamond, instead of a rectangle, and thus the non-rectangular display panel has a first boundary AB' as shown in FIG. 1, where a region surrounded by the first boundary AB' and the display region is non-rectangular. Sub pixels SP' in the display panel are generally in a rectangle shape or other regular structures, for example, sub pixels SP' shown in FIG. 1 are in the rectangle shape. In a case that the normal sub pixels SP' are applied in the non-rectangular display panel, the sub pixels SP' cannot completely match with the first boundary AB', which results in textures of a serrated line ST displayed in the display region of the non-rectangular display panel near the first boundary AB'. Therefore, a pattern at the boundary is unsmooth, which affects a display effect in the display region near the first boundary. The above problems also exist in the transflective and non-rectangular display panel.

Therefore, it is desired to provide a transflective and non-rectangular display panel and a display panel, to improve the display effect in the display region near the first boundary.

SUMMARY

In view of this, a transflective and non-rectangular display panel and a display device are provided in the present disclosure, to solve a problem of serrated display in the transflective and non-rectangular display panel.

A transflective and non-rectangular display panel is provided in the present disclosure.

The transflective and non-rectangular display panel includes a display region and a non-display region surrounding the display region. There is a first boundary between the display region and the non-display region, and a region surrounded by the first boundary and the display region is non-rectangular. The non-rectangular display panel further includes multiple pixels including multiple sub pixels. Each of the multiple pixels includes at least three of the multiple sub pixels. An open region of each of the multiple sub pixels has a transmissive region and a reflective region. The multiple pixels include normal pixels in the display region and abnormal pixels passed through by the first boundary. In each of the sub pixels of each of the abnormal pixels, the transmissive region includes a transmissive dark region and a transmissive light region, and the reflective region includes a reflective dark region and a reflective light region. The transflective and non-rectangular display panel further includes a light shielding layer. The transmissive dark region and the reflective dark region are provided with the light shielding layer. The transmissive light region and the reflective light region are not provided with the light shielding layer.

A display device is further provided in the present disclosure. The display device includes any one transflective and non-rectangular display panel provided in the present disclosure.

As compared with the conventional technology, the transflective and non-rectangular display panel and the display device provided in the present disclosure have the following advantageous effects.

For any one pixel passed through by the first boundary, that is, any one abnormal pixel, since each of the transmissive region and the reflective region is partially blocked by the light shielding layer and can partially emit light therefrom, the abnormal pixel has brightness less than brightness of the normal pixel and greater than brightness in the non-display region whether in a transmissive mode or in a reflective mode. Therefore, whether in the transmissive mode or in the reflective mode, all of the abnormal pixels form a brightness transition region between the display region and the non-display region. In this case, an edge of a light-emitting region formed by all of light-emitting pixels in the display panel on a micro level (i.e., on a pixel level) is a blurred boundary, and the formed edge is smooth whether in the transmissive mode or in the reflective mode on a macro level (when viewing the non-rectangular display panel as a whole), so that the probability of the serrated display can be reduced, thereby solving the serrated display problem in the transflective display panel.

Other features and advantages of the present disclosure become clear from exemplary embodiments of the present disclosure described in detail below with reference to the drawings.

BRIEF DESCRIPTION OF THE DRAWINGS

The drawings contained in the specification and forming a part of the specification show the embodiments of the present disclosure, and explain principles of the present disclosure together with the description thereof.

DETAILED DESCRIPTION OF THE EMBODIMENTS

Various exemplary embodiments of the present disclosure are described in detail with reference to the drawings. It should be noted that the relative arrangement of components and steps, numeric expressions and values described in the embodiments are not intended to limit the scope of the present disclosure, unless otherwise stated.

The following description for at least one exemplary embodiment is only illustrative, and is not intended to limit the present disclosure, and applications or uses of the present disclosure.

It should be noted that similar reference numbers and letters denote similar items in the following drawings. Therefore, once a certain item is defined in one of the drawings, the item is no more described in the following drawings.

Figure 2:
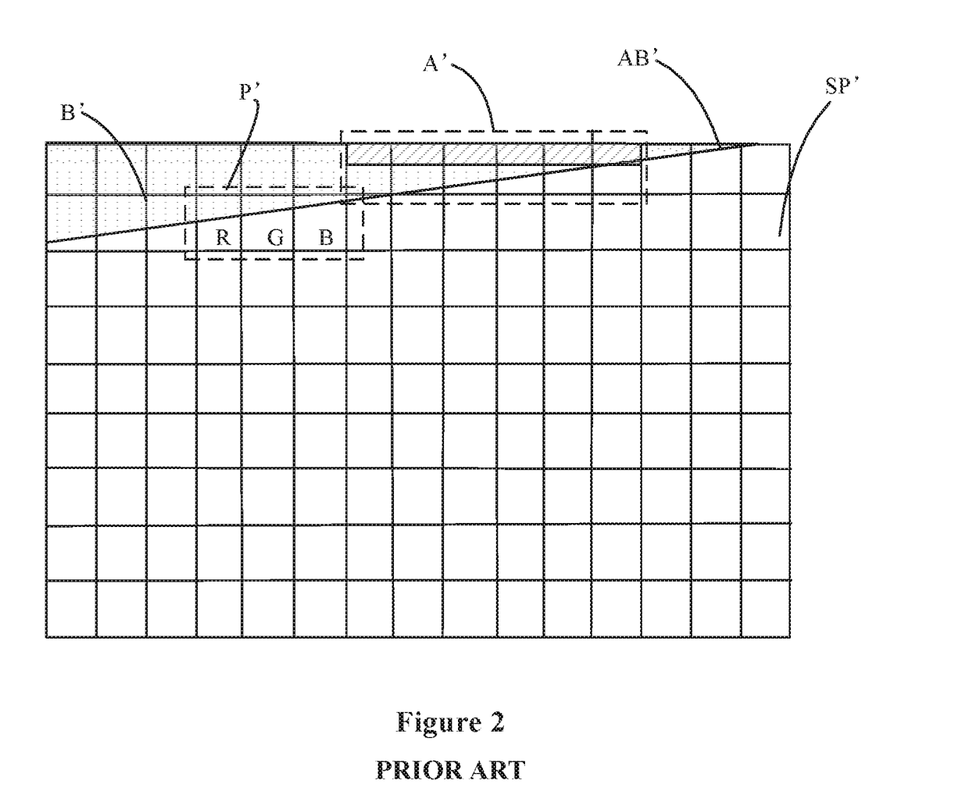
FIG. 2 is a schematic structural diagram of another non-rectangular display panel in the conventional technology.

In order to solve the serrated display problem at the boundary of the non-rectangular display panel, a solution is provided in the conventional technology. FIG. 2 is a schematic structural diagram of another non-rectangular display panel in the conventional technology. As shown in FIG. 2, the non-rectangular display panel has a first boundary AB', where a region surrounded by the first boundary AB' and the display region is non-rectangular. A light shielding layer B' is provided to block along the first boundary AB', so as to avoid serrated display at the first boundary AB'.

However, it is found based on research that in the solution for suppressing the serrated display, in one embodiment, for a display panel in which a pixel P' is composed of RGB sub pixels SP', a proportion of areas of the RGB sub pixels SP' is unbalanced, which results in color shift in display at the boundary. In another embodiment, for a transflective display panel, the serrated display cannot be suppressed at a part of positions at the first boundary. For example, in a region A' including six sub pixels SP' in FIG. 2, a transmissive region of each of the sub pixels SP' is blocked by the light shielding layer B' (the transmissive region is shown as a portion filled with oblique lines, and FIG. 2 only shows transmissive regions of the sub pixels SP' in the region A', does not shown transmissive regions of sub pixels SP' in other regions). That is, the sub pixels SP' in the region A' output light only in the reflective region. However, in a case that the transflective display panel is in a dark environment, the sub pixels SP' in the region A' emit light only in the transmissive region, rather than in the reflective region, which also results in the serrated display at the sub pixels SP'.

Suppressing the serrated display in the conventional technology not only cause the color shift, but also is not applicable to the transflective display panel. Based on above, a transflective and non-rectangular display panel and a display device are provided in the present disclosure, to solve the serrated display problem in the transflective display panel. Embodiments of the transflective and non-rectangular display panel and the display device provided in the present disclosure are described in detail below.

Figure 3:
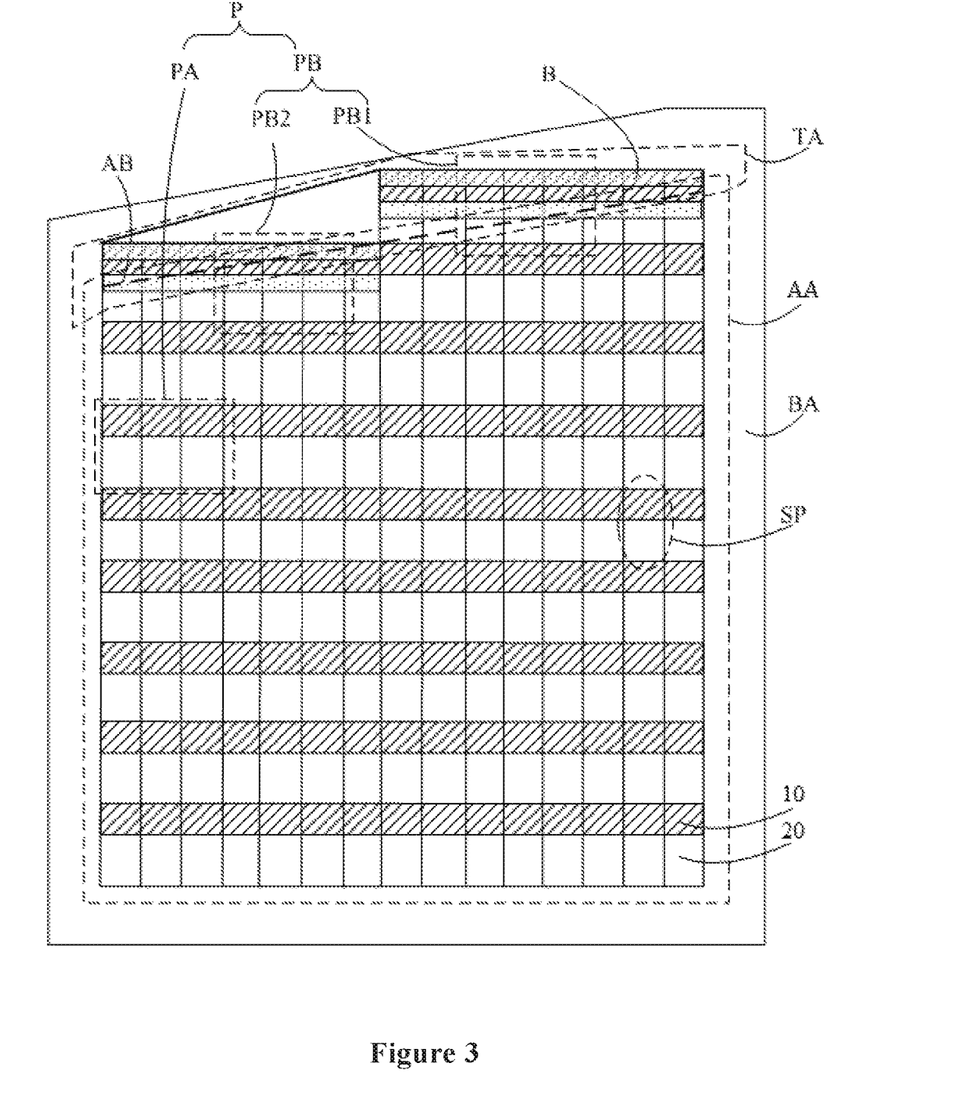
FIG. 3 is a schematic structural diagram of a transflective and non-rectangular display panel provided in the present disclosure.

FIG. 3 is a schematic structural diagram of a transflective and non-rectangular display panel provided in the present disclosure. As shown in FIG. 3, the transflective and non-rectangular display panel includes a display region AA and a non-display region BA surrounding the display region AA. There is a first boundary AB between the display region AA and the non-display region BA, and a region surrounded by the first boundary AB and the display region AA is non-rectangular.

It should be noted that the first boundary AB is an ideal theoretical boundary between the display region AA and the non-display region BA of the non-rectangular display panel in design. In the non-rectangular display panel in the conventional technology shown in FIG. 1, the theoretical boundary is the first boundary AB', but an actual edge of a light-emitting region formed by all of light-emitting pixels in the non-rectangular display panel is ST. In the non-rectangular display panel in the conventional technology shown in FIG. 2, the theoretical boundary is the first boundary AB' which is the same as an actual boundary of the display region. In the transflective and non-rectangular display panel provided in the present disclosure shown in FIG. 3, the theoretical boundary is the first boundary AB.

The transflective and non-rectangular display panel includes multiple pixels P including multiple sub pixels SP. Each of the multiple pixels P includes at least three of the multiple sub pixels SP. An open region of each of the multiple sub pixels SP has a transmissive region 10 and a reflective region 20. In an embodiment, a reflective layer (which is not shown in FIG. 3) is arranged in the reflective region 20 of each of the multiple sub pixels SP in the transflective and non-rectangular display panel. After external light is incident onto the reflective layer, the light is reflected to the reflective region 20 through the reflective layer and is emitted externally through the reflective region 20. In an embodiment, the transflective and non-rectangular display panel is a liquid crystal display panel, and light generated by a backlight source is outputted through the transmissive region 10. In an embodiment, the transflective and non-rectangular display panel is an organic light-emitting display panel, and an organic light-emitting display element is arranged in the transmissive region 10 and illuminates by itself to output light.

It should be noted that a relative position relationship between the transmissive region 10 and the reflective region 20 is not limited in the present disclosure. In an embodiment, as shown in FIG. 3, the transmissive region 10 and the reflective region 20 are respectively arranged at two ends of a rectangle-shaped pixel in a length direction. In another embodiment, the transmissive region 10 may be surrounded by the reflective region 20. The transmissive region 10 and the reflective region 20 may also be arranged in other manners.

The transflective and non-rectangular display panel according to the embodiment further includes a light shielding layer B (which is shown as a portion filled with dots in FIG. 3). For the liquid crystal display panel, the light shielding layer B may be arranged in the same layer as a black matrix (BM) for defining the sub pixels SP. For the organic light-emitting display panel, the light shielding layer B may be arranged on structures such as a base plate, a cover plate on a light-outputting side of the organic light-emitting display panel. The multiple pixels P in the transflective and non-rectangular display panel may be divided into two types, i.e., normal pixels PA in the display region AA, and abnormal pixels PB passed through by the first boundary AB.

In FIG. 3, the description is made by taking a first abnormal pixel PB1 as an example of the abnormal pixel PB in the transflective and non-rectangular display panel.

Figure 4:
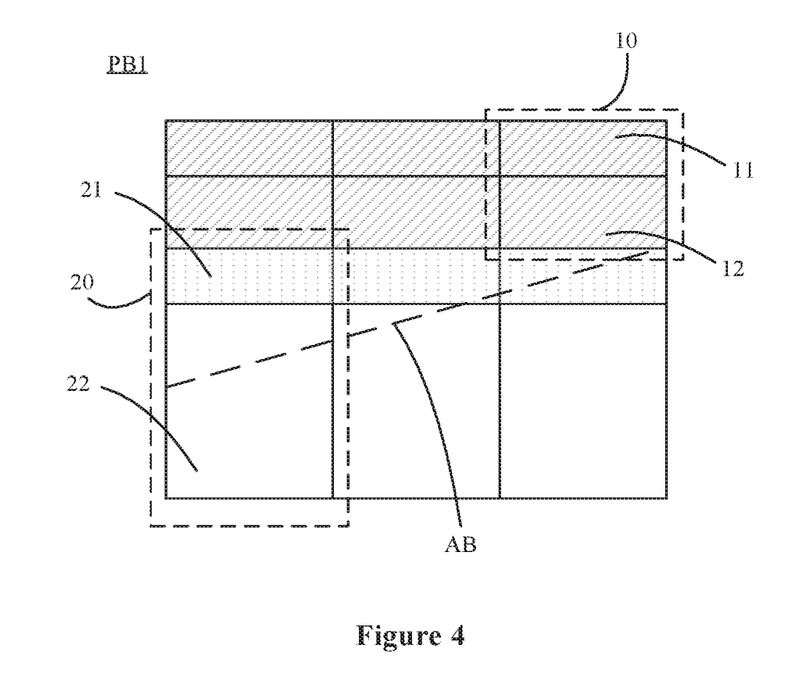
FIG. 4 is a schematic structural diagram of an abnormal pixel in the transflective and non-rectangular display panel provided in the present disclosure.

FIG. 4 is a schematic structural diagram of an abnormal pixel in the transflective and non-rectangular display panel provided in the present disclosure, which is obtained by enlarging the first abnormal pixel PB1 in FIG. 3. As shown in FIG. 3 and FIG. 4, a part of the transmissive region 10 of each of the sub pixels SP in the first abnormal pixel PB1 is provided with the light shielding layer B and thus cannot output light, and the other part of the transmission region 10 is not provided with the light shielding layer B and thus can output light. The part of the transmission region 10 provided with the light shielding layer B is referred to as a transmissive dark region 11, and the other part of the transmission region 10 not provided with the light shielding layer is referred to as a transmissive light region 12. That is, the transmissive region 10 includes the transmissive dark region 11 and the transmissive light region 12. In addition, a part of the reflective region 20 of each of the sub pixels SP in the abnormal pixel PB is provided with the light shielding layer B and thus cannot output light, and the other part of the reflective region 20 is not provided with the light shielding layer B and thus can output light. The part of the reflective region 20 provided with the light shielding layer B is referred to as a reflective dark region 21, and the other part of the reflective region 20 not provided with the light shielding layer B is referred to as a reflective light region 22. That is, the reflective region 20 includes the reflective dark region 21 and the reflective light region 22.

It should be noted that, different abnormal pixels PB in the non-rectangular display panel or different sub pixels in a same abnormal pixel PB may have the same ratio of an area of the transmissive dark region 11 to an area of the transmissive light region 12, that is, may be provided with the light shielding layers B having the same shape and area in the transmissive regions 10. For example, the light shielding layers B arranged in the transmissive regions 10 in the sub pixels of all of the abnormal pixels PB shown in FIG. 3 may have the same shape and area, or different shapes or areas. In one embodiment, a part of the light shielding layers B may have the same shape and area, and the other part of the light shielding layers B may have different shapes and areas. Further, different abnormal pixels PB or different sub pixels in a same abnormal pixel PB may have the same ratio of an area of the reflective dark region 21 to an area of the reflective light region 22, that is, may be provided with the light shielding layers B having the same shape and area in the reflective regions 20. For example, the light shielding layers B arranged in the reflective regions 20 in the sub pixels of all of the abnormal pixels PB shown in FIG. 3 may have the same shape and area, or different shapes or areas. In another embodiment, a part of the light shielding layers B may have the same shape and area, and the other part of the light shielding layers B may have different shapes and areas.

Figure 5:
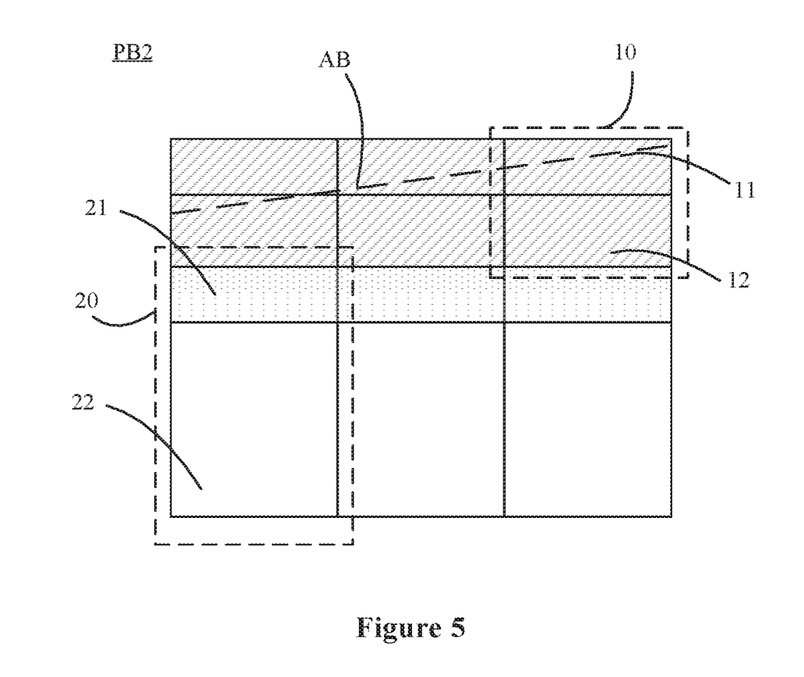
FIG. 5 is a schematic structural diagram of another abnormal pixel in the transflective and non-rectangular display panel provided in the present disclosure.

A second abnormal pixel PB2 is taken as another example of the abnormal pixel PB in the transflective and non-rectangular display panel. FIG. 5 is a schematic structural diagram of another abnormal pixel in the transflective and non-rectangular display panel provided in the present disclosure, which is obtained by enlarging the second abnormal pixel PB2 shown in FIG. 3. With reference to FIG. 3, FIG. 4 and FIG. 5, for the first abnormal pixel PB1 in which each transmissive region 10 is completely located on a side of the first boundary AB close to the non-display region BA, since the transmissive region 10 includes the transmissive light region 12 and the reflective region 20 includes the reflective light region 22, the first abnormal pixel PB1 can output light whether in the transmissive mode or in the reflective mode. For the second abnormal pixel PB2 in which each transmission region 10 is partially located on a side of the first boundary AB close to the non-display region BA and is partially located on a side of the first boundary AB close to the display region AA, since the transmissive region 10 includes the transmissive light region 12 and the reflective region 20 includes the reflective outputting region 22, the second abnormal pixel PB2 can output light whether in the transmissive mode or in the reflective mode.

To sum up, for any one pixel P passed through by the first boundary AB, that is, any one abnormal pixel PB, since each of the transmissive region 10 and the reflective region 20 is partially blocked by the light shielding layer B, and can partially output light therefrom, the abnormal pixel PB has brightness less than brightness of the normal pixel PA and greater than brightness in the non-display region BA whether in the transmissive mode or in the reflective mode. Therefore, whether in the transmissive mode or in the reflective mode, all of the abnormal pixels PB form a brightness transition region TA between the display region AA and the non-display region BA. In this case, an edge of a light-emitting region formed by all of light-emitting pixels in the display panel on a micro level (i.e., on a pixel level) is a blurred boundary, and the formed edge is smooth whether in the transmissive mode or in the reflective mode on a macro level (when viewing the non-rectangular display panel as a whole), so that the probability of the serrated display can be reduced, thereby solving the serrated display problem in the transflective display panel.

Figure 6:
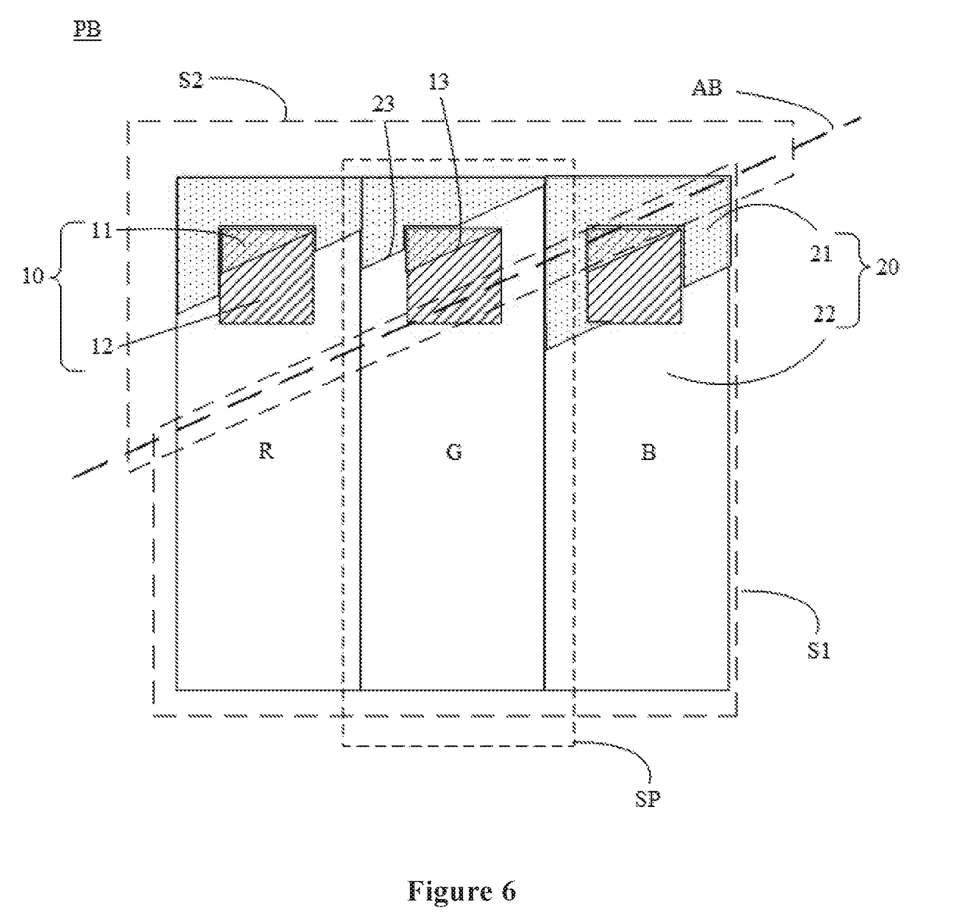
FIG. 6 is a schematic structural diagram of another abnormal pixel in the transflective and non-rectangular display panel provided in the present disclosure.
Figure 7:
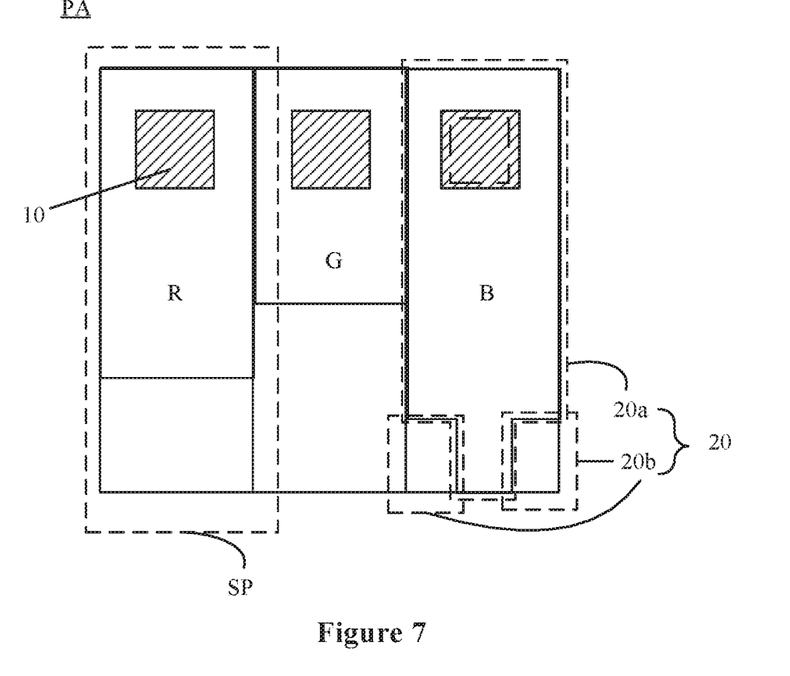
FIG. 7 is a schematic structural diagram of a normal pixel in the transflective and non-rectangular display panel provided in the present disclosure.

FIG. 6 is a schematic structural diagram of another abnormal pixel in the transflective and non-rectangular display panel provided in the present disclosure. FIG. 7 is a schematic structural diagram of a normal pixel in the transflective and non-rectangular display panel provided in the present disclosure. In an embodiment, each sub pixel in a pixel has a transmissive region and a reflective region. As shown in FIG. 6, each sub pixel SP in an abnormal pixel PB has a transmissive region 10 and a reflective region 20. As shown in FIG. 7, each sub pixel SP in a normal pixel PA has a transmissive region 10 and a reflective region 20. The reflective region 20 surrounds the transmissive region 10 whether in the abnormal pixel PB or in the normal pixel PA.

For the abnormal pixel PB, as shown in FIG. 6, the transmissive region 10 includes a transmissive dark region 11 and a transmissive light region 12, and the reflective region 20 includes a reflective dark region 21 and a reflective light region 22. A second boundary 13 between the transmissive dark region 11 and the transmissive light region 12 in each sub pixel SP is parallel to the first boundary AB, so that an edge of a light-emitting region formed by all of light-emitting pixels in the transflective and non-rectangular display panel on a macro level is approximate to the first boundary AB in a case that the display panel operates in the transmissive mode, thereby improving the display effect of the transflective and non-rectangular display panel.

In an embodiment, with reference to FIG. 6, for the abnormal pixel PB, a third boundary 23 between the reflective dark region 21 and the reflective light region 22 in each sub pixel SP is parallel to the first boundary AB, so that an edge of a light-emitting region formed by all of light-emitting pixels in the transflective and non-rectangular display panel on a macro level is approximate to the first boundary AB in a case that the display panel operates in the reflective mode, thereby improving the display effect of the transflective and non-rectangular display panel.

In an embodiment, with reference to FIG. 6, areas of transmissive light regions 12 of all of the sub pixels SP in a single abnormal pixel PB are equal to each other. In a case that the pixel P of the transflective and non-rectangular display panel includes three sub pixels for respectively generating red light, green light and blue light, areas of the transmissive light regions 12 of all of the sub pixels SP in the abnormal pixel PB may be equal to each other, so that luminous fluxes of the sub pixels generating the three colors of light in the abnormal pixel PB are equal to each other under a same driving voltage in a case that the transflective and non-rectangular display panel operates in the transmissive mode, thereby avoiding the color shift of the abnormal pixel PB.

In an embodiment, with reference to FIG. 6, areas of transmissive regions 10 of all of the sub pixels SP in the abnormal pixel PB of the transflective and non-rectangular display panel are equal to each other. With reference to FIG. 7, areas of transmissive regions 10 of all of the sub pixels SP in the normal pixel PA of the transflective and non-rectangular display panel are equal to each other. Further, an area of the transmissive region 10 of the sub pixel SP in the abnormal pixel PB is equal to an area of the transmissive region 10 of the sub pixel SP in the normal pixel PA. That is, areas of transmissive regions 10 of all of the sub pixels SP in the transflective and non-rectangular display panel are equal to each other.

According to the embodiment, the transmissive regions 10 of all of the sub pixels SP in the non-rectangular display panel may be manufactured with the same process parameter, so as to simplify the process and save the cost.

With reference to FIG. 6, the abnormal pixel PB is divided into a first portion S1 close to the display region and a second portion S2 close to the non-display region by the first boundary AB. A ratio of an area of the transmissive light region 12 to an area of the transmissive region 10 in a single sub pixel SP of the abnormal pixel PB is denoted as a first area ratio K1, and a ratio of an area of the first portion S1 to an area (S1+S2) of the pixel is denoted as a second area ratio K2. The first area ratio K1 is equal to the second area ratio K2.

If an edge of a light-emitting region formed by all of light-emitting pixels in the non-rectangular display panel on a micro level is the same as the first boundary AB, the ideal theoretical boundary of the non-rectangular display panel is achieved. That is, light can be generated at any position of the display region of the non-rectangular display panel located on one side of the first boundary AB, and no light is generated at any position of the non-display region of the non-rectangular display panel located on the other side of the first boundary AB. It is ideal for an abnormal pixel PB that light is generated only in a first portion S1 of the abnormal pixel PB. However, since a shape of the rectangle-shaped pixel is different from a shape of the non-rectangular display panel, the ideal abnormal pixel PB described above is difficult to be implemented in the transflective and non-rectangular display panel. With the transflective and non-rectangular display panel according to the embodiment, the ratio of an area of the transmissive light region 12 to an area of the transmissive region 10 in the abnormal pixel PB is set to be equal to the ratio of an area of the first portion S1 to an area of the abnormal pixel PB, so that the ratio of the area of a region that can emit light therefrom to be seen by a viewer to the area of the transmissive region 10 in the abnormal pixel PB is equal to a ratio of an area of a light-emitting region in the ideal abnormal pixel PB to an area of the whole abnormal pixel PB in the transmissive mode of the non-rectangular display panel, and thus an edge of the light-emitting region formed by all of light-emitting pixels on a macro level is approximate to the first boundary AB in the transmissive mode of the non-rectangular display panel, thereby improving the display effect of the transflective and non-rectangular display panel.

Figure 8:
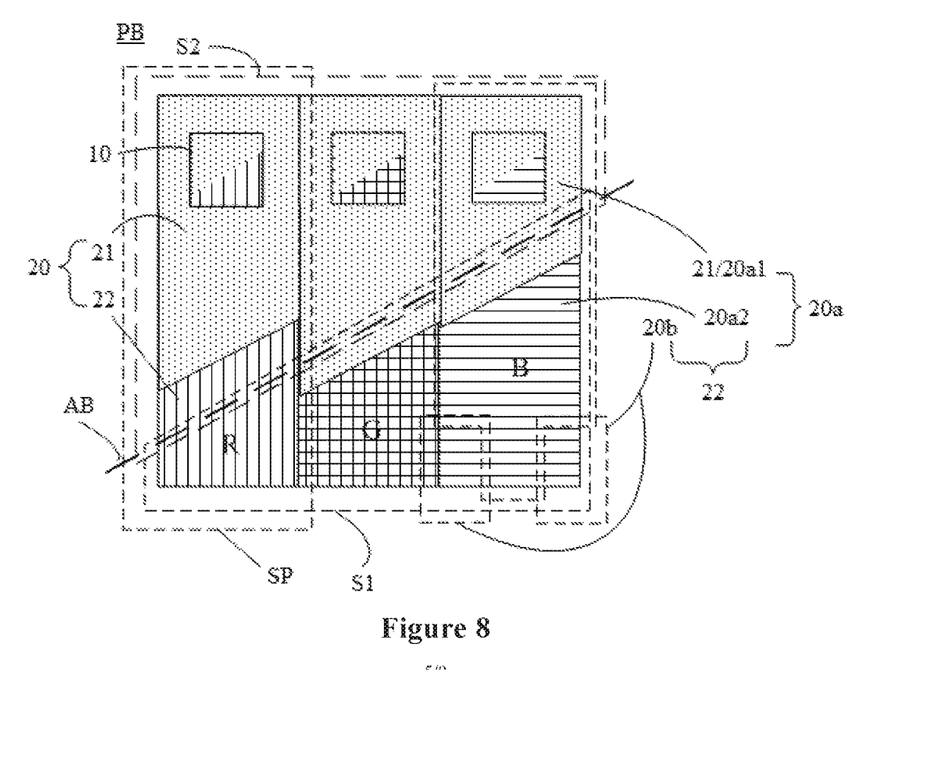
FIG. 8 is a schematic structural diagram of another abnormal pixel in the transflective and non-rectangular display panel provided in the present disclosure.

FIG. 8 is a schematic structural diagram of another abnormal pixel in the transflective and non-rectangular display panel provided in the present disclosure. In an embodiment, with reference to FIG. 7 and FIG. 8, FIG. 7 shows a structure of a normal pixel PA according to the embodiment, and FIG. 8 shows a structure of an abnormal pixel PB according to the embodiment. It can be seen from FIG. 7 and FIG. 8 that the non-rectangular display panel includes a color resistance layer. The color resistance layer includes different colors of color resistances. Whether in the normal pixel PA or in the abnormal pixel PB, the open regions of all of the sub pixels are covered with color resistances with different colors and different areas. For example, the pixel includes three sub pixels SP, a red color resistance R, a green color resistance G and a blue color resistance B are arranged sequentially in the three sub pixels SP. The red color resistance R, the green color resistance G or the blue color resistance B is arranged in each of the transmissive region 10 and the reflective region 20 of the sub pixel SP provided with the corresponding color resistance.

Areas of different colors of color resistances covering the open regions of all of the sub pixels in a pixel are set to be different from each other. In this case, in the normal pixel PA, areas of the color resistances arranged in all of the transmissive regions 10 are equal to each other, and areas of the color resistances arranged in all of the reflective regions 20 are different from each other. Further, in the abnormal pixel PB, areas of the color resistances arranged in all of the transmissive dark regions 11 are equal to each other, areas of the color resistances arranged in all of the transmissive light regions 12 are equal to each other, and areas of the color resistances arranged in all of the reflective light regions 22 are different from each other. In the embodiment, the areas of different colors of color resistances are set to be different from each other, to compensate for the color shift caused by different reflective characteristics of different colors of light.

The color resistances with different areas may be arranged in the reflective regions 20 of the normal pixel PA in the following two manners. In a first manner, each of the reflective regions 20 is completely covered with a color resistance corresponding to the reflective region 20, and areas of the reflective regions 20 are different from each other. That is, areas of the open regions of all of the sub pixels SP in the normal pixel PA are different from each other. In a second manner, a part of each of the reflective regions 20 is covered with the color resistance corresponding to the reflective region 20, and areas of parts of the reflective regions 20 covered with the different color resistances are different from each other. In this case, areas of the open regions of all of the sub pixels SP in the normal pixel PA are equal to each other, as shown in FIG. 7.

A ratio of areas of the color resistances in the reflective light regions 22 of the sub pixels SP in the abnormal pixel PB is denoted as a third area ratio, and a ratio of areas of the color resistances in the reflective regions 20 of the sub pixels SP in the normal pixel PA is denoted as a fourth area ratio. Colors of the color resistances in the third area ratio are arranged in the same order as those in the fourth area ratio. The third area ratio is equal to the fourth area ratio. For example, the third area ratio K3 is a ratio of an area of the red color resistance R to an area of the green color resistance G to an area of the blue color resistance B in the reflective light regions 22 in the abnormal pixel PB. The fourth area ratio K4 is a ratio of an area of the red color resistance R to an area of the green color resistance G to an area of the blue color resistance B in the reflective regions 20 of the normal pixel PA. In this case, K3=K4.

According to the embodiment, the ratio of the areas of the color resistances in the reflective light regions 22 in the abnormal pixel PB is equal to the ratio of the areas of the corresponding color resistances in the reflective regions 20 of the normal pixel PA, so that all of pixels in the non-rectangular display panel has the same chromaticity of white color, thereby obtaining good uniformity of the whole chromaticity of the non-rectangular display panel.

In an embodiment, with reference to FIG. 7 and FIG. 8, the abnormal pixel PB is divided into a first portion S1 close to the display region and a second portion S2 close to the non-display region by the first boundary AB. A ratio of an area of the first portion S1 to an area (S1+S2) of the pixel is denoted as a second area ratio K2. A ratio of an area of the color resistance (the red color resistance R, the green color resistance G or the blue color resistance B) with a first color in the reflective light regions 22 in the abnormal pixel PB to an area of the color resistance with the first color in the reflective regions 20 in the normal pixel PA is denoted as a fifth area ratio K5. The second area ratio K2 is equal to the fifth area ratio K5. The first color is a color of any one of the color resistances in the color resistance layer.

With the transflective and non-rectangular display panel according to the embodiment, the ratio of an area of the color resistance in the reflective light region 22 of the abnormal pixel PB to an area of a color resistance in the reflective region 20 of the normal pixel PA having the same color as the color resistance in the reflective light region 22 of the abnormal pixel PB is set to be equal to the ratio of an area of the first portion S1 to an area of the abnormal pixel PB, so that a ratio of an area of a light-emitting region in the abnormal pixel PB to an area of a light-emitting region in the normal pixel PA generating the same color of light as the light-emitting region in the abnormal pixel PB is equal to the ratio of an area of a light-emitting region in the ideal abnormal pixel PB to an area of the whole abnormal pixel PB in the reflective mode of the non-rectangular display panel, and thus an edge of a light-emitting region formed by all of light-emitting pixels on a macro level is approximate to the first boundary AB in the reflective mode of the non-rectangular display panel, thereby improving the display effect of the transflective and non-rectangular display panel.

Figure 9:
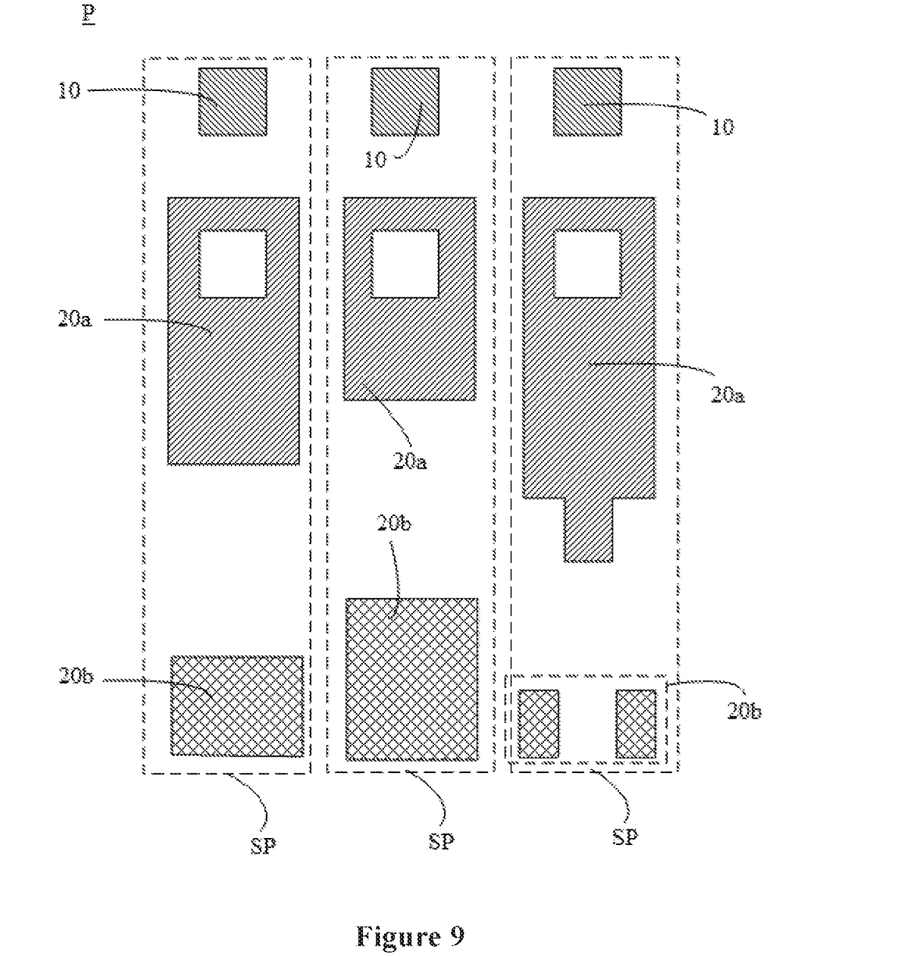
FIG. 9 is a schematic exploded view of a pixel in the transflective and non-rectangular display panel provided in the present disclosure.

FIG. 9 is a schematic exploded view of a pixel in the transflective and non-rectangular display panel provided in the present disclosure. In an embodiment, whether in the normal pixel or in the abnormal pixel, the reflective region of each sub pixel includes two parts, that is, a first reflective region and a second reflective region. As shown in FIG. 9, each sub pixel SP in a pixel P includes three regions including a transmissive region 10, a first reflective region 20a and a second reflective region 20b. That is, both the normal pixel and the abnormal pixel include the above three regions.

With reference to FIG. 7 and FIG. 9, for each of the sub pixels in the normal pixel PA, the first reflective region 20a is completely covered with a color resistance, and light emitted from the first reflective region 20a has the same color as the color resistance. The second reflective region 20b is used for emitting white light. The brightness of the transflective and non-rectangular display panel can be enhanced with the second reflective region 20b.

For the abnormal pixel, the reflective region is divided in the same manner as the normal pixel. However, since the reflective region of the abnormal pixel is provided with the light shielding layer, light outputting situations of the first reflective region and the second reflective region in the abnormal pixel are different from light outputting situations of the first reflective region and the second reflective region in the normal pixel, respectively. In the abnormal pixel, a part of the first reflective region is covered with a color resistance to form a part of the reflective light region, and the other part of the first reflective region is provided with the light shielding layer to form a part of the reflective dark region. The second reflective region may be arranged in the following two arrangement manners.

In a first arrangement manner, the second reflective region is completely covered with a color resistance, and does not emit white light therefrom.

As shown in FIG. 8, for each of the sub pixels in the abnormal pixel PB, the part of the first reflective region 20a covered with the color resistance is a first color resistance reflective light region 20a2, and the part of the first reflective region 20a provided with the light shielding layer is a first reflective dark region 20a1. The second reflective region 20b of the abnormal pixel PB is completely covered with the color resistance. The color resistance in the second reflective region 20b is integrated with the color resistance in the first reflective region 20a. Therefore, the reflective light region 22 of each of the sub pixels in the abnormal pixel PB includes the second reflective region 20b and the first color resistance reflective light region 20a2, and the reflective dark region 21 includes the first reflective dark region 20a1.

In the first arrangement manner, the second reflective region 20b of the abnormal pixel PB is completely filled with the color resistance but is not provided with the light shielding layer. In this case, the light shielding layer of the sub pixel SP may be not partitioned and is completely arranged in a region on an end of the abnormal pixel PB close to the transmissive region 10, so that the light shielding layer in the transmissive region 10 is integrated with the light shielding layer in the reflective region 20. Therefore, for a transflective and non-rectangular display panel with low resolution, a black dot generated due to the partitioned light shielding layer can be avoided in the first arrangement manner.

Figure 10:
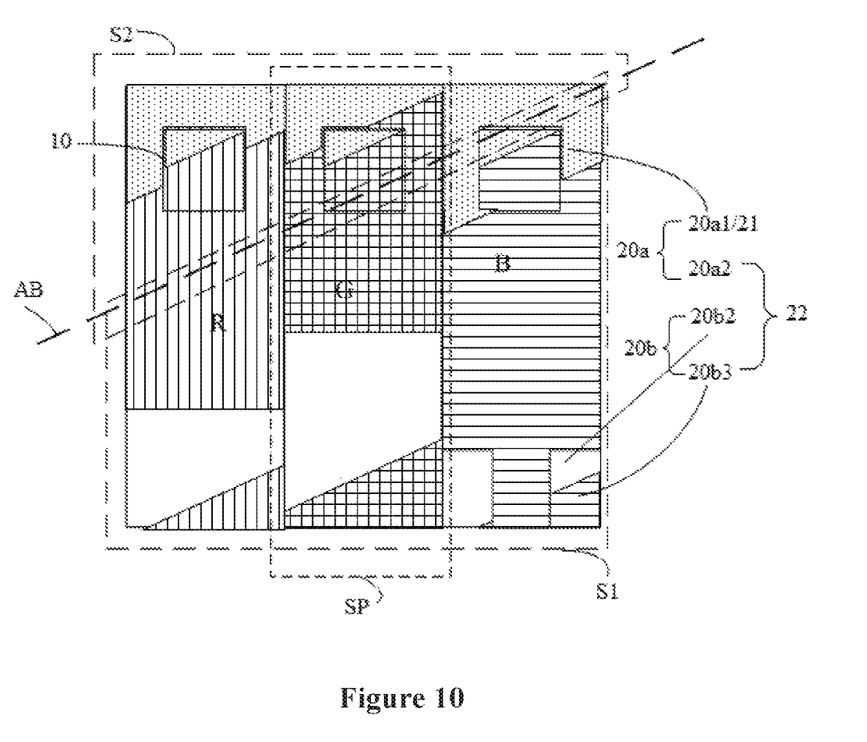
FIG. 10 is a schematic structural diagram of another abnormal pixel in the transflective and non-rectangular display panel provided in the present disclosure.
Figure 11:
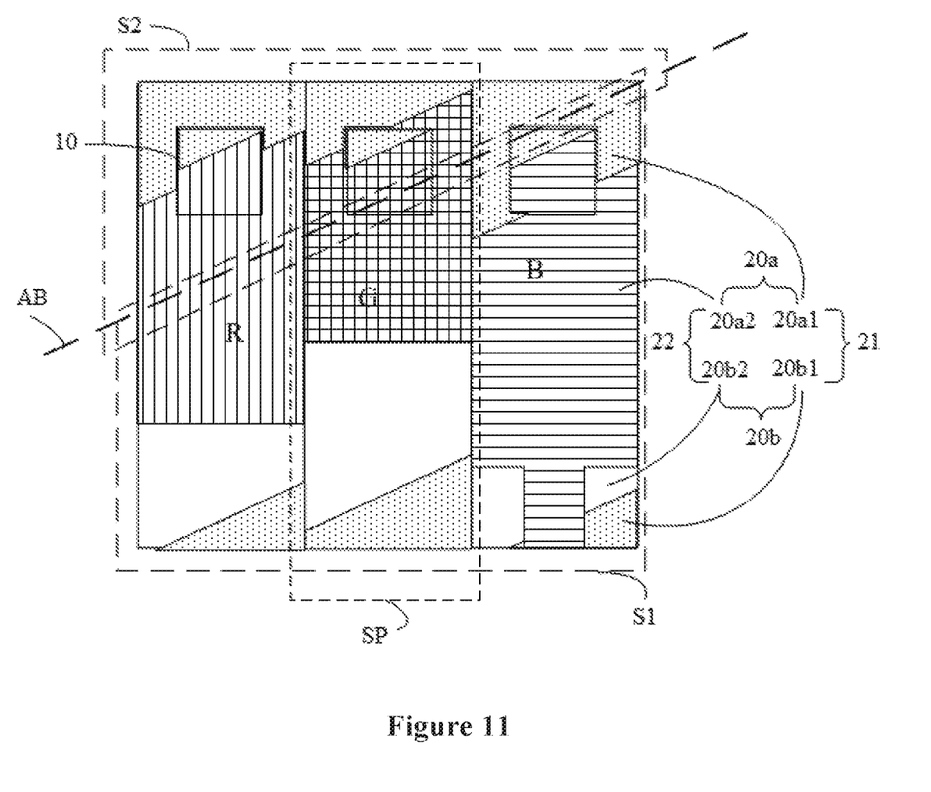
FIG. 11 is a schematic structural diagram of another abnormal pixel in the transflective and non-rectangular display panel provided in the present disclosure.

In a second arrangement manner, the second reflective region is provided with a white light reflective region, and thus the second reflective region can emit white light therefrom. FIG. 10 is a schematic structural diagram of another abnormal pixel in the transflective and non-rectangular display panel provided in the present disclosure. FIG. 11 is a schematic structural diagram of another abnormal pixel in the transflective and non-rectangular display panel provided in the present disclosure. The second arrangement manner may be described with reference to FIG. 10 and FIG. 11.

For each of the sub pixels in the abnormal pixel PB, a part of the second reflective region 20b is a white light reflective light-emitting region 20b2 emitting white light, which is not provided with the light shielding layer and is not covered with color resist.

A ratio of an area of the white light reflective light-emitting region 20b2 of the sub pixel in the abnormal pixel PB generating light with the first color to an area of the second reflective region 20b in the reflective region 20 of the sub pixel in the normal pixel PA generating the light with the first color is denoted as a sixth area ratio K6. The sixth area ratio K6 is equal to the second area ratio K2.

With the transflective and non-rectangular panel formed in the second arrangement manner, the reflective light region of the abnormal pixel PB further includes the white light reflective light-emitting region 20b2 emitting white light, to ensure brightness of the abnormal pixel PB. Further, the ratio of an area of the white light reflective light-emitting region 20b2 of the sub pixel in the abnormal pixel to an area of the second reflective region of the sub pixel in the normal pixel generating light with the same color as the sub pixel of the abnormal pixel is set to be equal to the ratio (that is, the second area ratio) of an area of the first portion S1 to an area of the abnormal pixel PB, so that a ratio of an area of a light-emitting region in the abnormal pixel PB to an area of a light-emitting region in the normal pixel PA generating light with the same color as the light-emitting region in the abnormal pixel PB is equal to the ratio of an area of a light-emitting region in the ideal abnormal pixel PB to an area of the whole abnormal pixel PB in the reflective mode in the non-rectangular display panel, and thus an edge of a light-emitting region formed by all of light-emitting pixels on a macro level is approximate to the first boundary AB in the reflective mode of the non-rectangular display panel, thereby improving the display effect of the transflective and non-rectangular display panel.

The above second arrangement manner includes two situations.

In a first situation, a part of the second reflective region in the abnormal pixel is covered with a color resistance.

As shown in FIG. 10, the second reflective region 20b of each of the sub pixels in the abnormal pixel PB is provided with the color resistance, so that a ratio of an area of the white light reflective light-emitting region 20b2 in the sub pixel of the abnormal pixel PB to an area of the second reflective region of the sub pixel in the normal pixel emitting light with the same color as the sub pixel of the abnormal pixel PB is equal to the second area ratio. The color resistance in the second reflective region 20b and the color resistance in the first reflective region 20a in the abnormal pixel PB may be provided separately or as a whole.

With reference to FIG. 10, in each of the sub pixels in the abnormal pixel PB, the part of the first reflective region 20a covered with the color resistance is a first color resistance reflective light region 20a2, and the part of the first reflective region 20a provided with the light shielding layer is a first reflective dark region 20a1. Further, the part of the second reflective region 20b covered with the color resistance is a second color resistance reflective light region 20b3, and the other part of the second reflective region 20b than the second color resistance reflective light region 20b3 is the white light reflective light-emitting region 20b2 emitting white light described above. That is, the whole second reflective region 20b can emit light therefrom. Therefore, in each of the sub pixels in the abnormal pixel PB, the reflective light region 22 includes the second reflective region 20b (that is, the second color resistance reflective light region 20b3 and the white light reflective light-emitting region 20b2) and the first color resistance reflective light region 20a2, and the reflective dark region 21 includes the first reflective dark region 20a1.

In the first situation, the sixth area ratio described above is equal to the second area ratio, and the second reflective region 20b of each of the sub pixels in the abnormal pixel PB is not provided with the light shielding layer, so that an edge of a light-emitting region formed by all of light-emitting pixels on a macro level is approximate to the first boundary AB in a case that the non-rectangular display panel operates in the reflective mode, and a black dot generated due to the partitioned light shielding layer can be avoided.

In a second situation, a part of the second reflective region in the abnormal pixel is provided with the light shielding layer.

As shown FIG. 11, the second reflective region 20b of the abnormal pixel PB is provided with the light shielding layer, so that a ratio of an area of the white light reflective light-emitting region 20b2 in the sub pixel of the abnormal pixel PB to an area of the second reflective region of the sub pixel in the normal pixel emitting light with the same color as the sub pixel of the abnormal pixel PB is equal to the second area ratio.

With reference to FIG. 11, in each of the sub pixels of the abnormal pixel PB, the part of the first reflective region 20a covered with the color resistance is a first color resistance reflective light region 20a2, and the part of the first reflective region 20a provided with the light shielding layer is a first reflective dark region 20a1. Further, the part of the second reflective region 20b provided with the light shielding layer is a second reflective dark region 20b1, and the other part of the second reflective region 20b than the second reflective dark region 20b1 is the white light reflective light-emitting region 20b2 emitting white light described above. Therefore, in each of the sub pixels of the abnormal pixel PB, the reflective light region 22 includes the white light reflective light-emitting region 20b2 and the first color resistance reflective light region 20a2, and the reflective dark region 21 includes the first reflective dark region 20a1 and the second reflective dark region 20b1.

In the second situation, each of the transmissive region, the first reflective region and the second reflective region of the abnormal pixel B is provided with the light shielding to layer, so that an edge of a light-emitting region formed by all of light-emitting pixels on a macro level is approximate to the first boundary AB in a case that the non-rectangular display panel operates in the reflective mode.

It is found based on research that in the simulation for the chromaticity of white color, in a case that the reflective regions 20 of the normal pixel PA are provided with color resistances with the same area, the chromaticity of white color in the normal pixel PA appears yellow. In addition, in a case that the reflective light regions 22 of the abnormal pixel PB are provided with color resistances with the same area, the chromaticity of white color in the abnormal pixel PB also appears yellow. In an embodiment, with reference to FIG. 7 and FIG. 8, the color resistance layer includes three colors of color resistances, that is, the red color resistance, the green color resistance and the blue color resistance. Areas of the blue color resistance B, the red color resistance R and the green color resistance G are decreased sequentially, so as to avoid the color shift of the chromaticity of white color.

Figure 12:
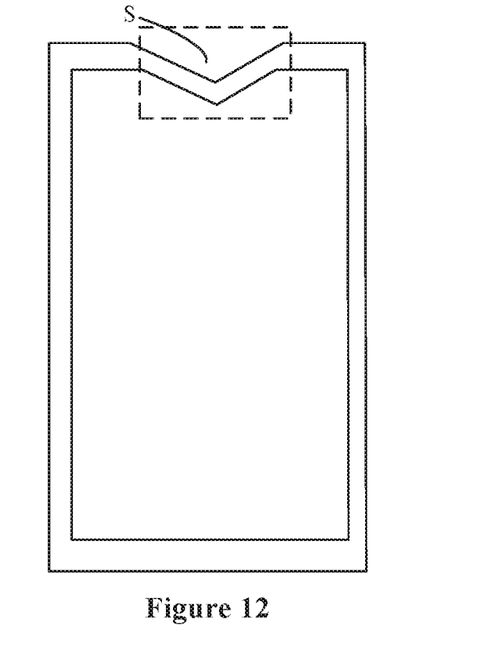
FIG. 12 is a schematic structural diagram of a display device provided in the present disclosure.
Figure 13:
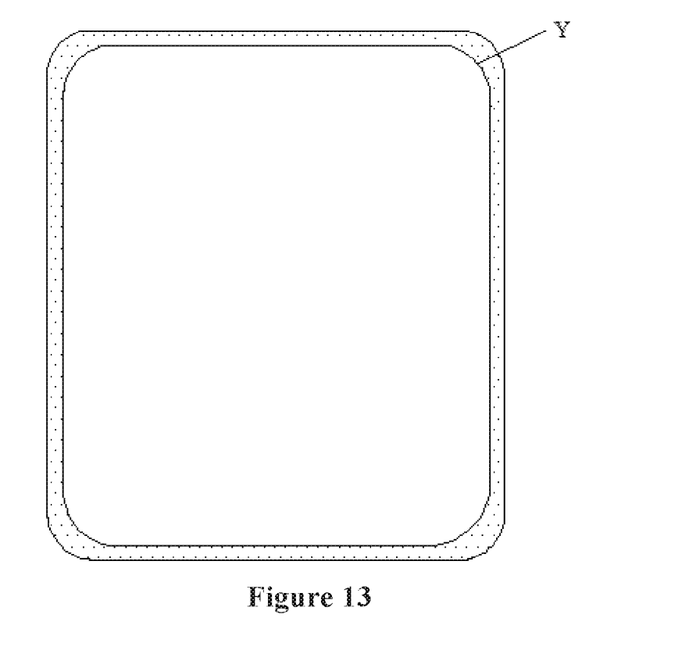
FIG. 13 is a schematic structural diagram of another display device provided in the present disclosure.

Based on the transflective and non-rectangular display panel described above, a display device is further provided in the present disclosure. The display device includes any one transflective and non-rectangular display panel described above, and has characteristics of the any one transflective and non-rectangular display panel described above, which are not repeated herein. FIG. 12 is a schematic structural diagram of a display device provided in the present disclosure. A part of a display region of a transflective regular display panel may be removed to accommodate a camera, an earpiece or the like. As shown in FIG. 12, the removed part S is in a triangle shape, or may also be in a chamfered rectangle shape, a circular shape, an oval shape or other shapes, to form a display device with a non-rectangular display panel. In addition. FIG. 13 is a schematic structural diagram of another display device provided in the present disclosure. As shown in FIG. 13, the transflective display panel of the display device is a display panel in a chamfered rectangle shape having a chamfer Y, which may also be a circular display panel, a ring-shaped display panel or other non-rectangular display panels than the rectangle-shaped display panel.

It can be known from the above embodiments that, with the transflective and non-rectangular display panel and the display device provided in the present disclosure, an edge formed by all of light-emitting pixels in the transflective and non-rectangular display panel on a micro level and a macro level is smooth whether in the transmissive mode or in the reflective mode, so that the probability of the serrated display can be reduced, thereby solving the serrated display problem in the transflective display panel.

The invention claimed is:

1. A transflective and non-rectangular display panel, comprising:
   a display region;
   a non-display region surrounding the display region, wherein there is a first boundary between the display region and the non-display region, and a region surrounded by the first boundary is non-rectangular;
   a plurality of pixels comprising a plurality of sub pixels, wherein each of the plurality of pixels comprises at least three of the plurality of sub pixels, and an open region of each of the plurality of sub pixels has a transmissive region and a reflective region, the plurality of pixels comprises normal pixels in the display region and abnormal pixels passed through by the first boundary, wherein in each of the sub pixels of each of the abnormal pixels, the transmissive region comprises a transmissive dark region and a transmissive light region, and the reflective region comprises a reflective dark region and a reflective light region; and
   a light shielding layer, wherein the transmissive dark region and the reflective dark region are provided with the light shielding layer, and the transmissive light region and the reflective light region are not provided with the light shielding layer.

2. The transflective and non-rectangular display panel according to claim 1, wherein
   for each of the sub pixels of each of the abnormal pixels, a second boundary between the transmissive dark region and the transmissive light region is parallel to the first boundary.

3. The transflective and non-rectangular display panel according to claim 1, wherein
   for each of the sub pixels of each of the abnormal pixels, a third boundary between the reflective dark region and the reflective light region is parallel to the first boundary.

4. The transflective and non-rectangular display panel according to claim 1, wherein
   areas of transmissive light regions of all of the sub pixels in each of the plurality of pixels are equal to each other.

5. The transflective and non-rectangular display panel according to claim 4, wherein
   areas of transmissive regions of all of the plurality of sub pixels in the non-rectangular display panel are equal to each other,
   each of the abnormal pixels is divided into a first portion close to the display region and a second portion close to the non-display region by the first boundary, and
   for each of the abnormal pixels, a ratio of an area of the transmissive light region in each of the sub pixels of the abnormal pixel to an area of the transmissive region in the sub pixel is denoted as a first area ratio, and a ratio of an area of the first portion of the abnormal pixel to an area of the abnormal pixel is denoted as a second area ratio, wherein the first area ratio is equal to the second area ratio.

6. The transflective and non-rectangular display panel according to claim 1, further comprising:
   a color resistance layer comprising different colors of color resistances, wherein
   the open regions of the sub pixels in each of the plurality of pixels are covered with color resistances with different colors and different areas, and
   a ratio of areas of the color resistances in the reflective light regions of the sub pixels in each of the abnormal pixels is denoted as a third area ratio, and a ratio of areas of the color resistances in the reflective regions of the sub pixels in each of the normal pixels is denoted as a fourth area ratio, wherein colors of the color resistances in the third area ratio are arranged in the same order as those in the fourth area ratio, and the third area ratio is equal to the fourth area ratio.

7. The transflective and non-rectangular display panel according to claim 6, wherein
   each of the abnormal pixels is divided into a first portion close to the display region and a second portion close to the non-display region by the first boundary, and
   a ratio of an area of the first portion in each of the abnormal pixels to an area of the abnormal pixel is denoted as a second area ratio, and a ratio of an area of the color resistance with a first color in the reflective light regions in each of the abnormal pixels to an area of the color resistance with the first color in the reflective regions in each of the normal pixels is denoted as a fifth area ratio, wherein the second area ratio is equal to the fifth area ratio, and the first color is a color of any one of the color resistances in the color resistance layer.

8. The transflective and non-rectangular display panel according to claim 7, wherein
the reflective region of each of the sub pixels in each of the plurality of pixels comprises a first reflective region and a second reflective region;
for each of the sub pixels in each of the normal pixels, the first reflective region is covered with the color resistance, and the second reflective region emits white light therefrom; and
for each of the sub pixels in each of the abnormal pixels, a part of the first reflective region is covered with the color resistance, and the other part of the first reflective region is provided with the light shielding layer, and the second reflective region is completely covered with the color resistance, wherein the reflective light region comprises the part of the first reflective region covered with the color resistance and the second reflective region, and the reflective dark region comprises the part of the first reflective region provided with the light shielding layer.

9. The transflective and non-rectangular display panel according to claim 7, wherein
the reflective region of each of the sub pixels in each of the plurality of pixels comprises a first reflective region and a second reflective region,
for each of the sub pixels in each of the normal pixels, the first reflective region is covered with the color resistance, and the second reflective region is not provided with the color resistance; and
for each of the sub pixels in each of the abnormal pixels, a part of the first reflective region is covered with the color resistance, and the other part of the first reflective region is provided with the light shielding layer, and a part of the second reflective region emits white light therefrom, wherein the part of the second reflective region emitting white light therefrom is a white light reflective light-emitting region, and
a ratio of an area of the white light reflective light-emitting region of the sub pixel in the abnormal pixel generating light with the first color to an area of the second reflective region of the sub pixel in the normal pixel generating the light with the first color is denoted as a sixth area ratio, wherein the sixth area ratio is equal to the second area ratio.

10. The transflective and non-rectangular display panel according to claim 9, wherein
in each of the sub pixels in each of the abnormal pixels, the other part of the second reflective region is covered with the color resistance, and the reflective light region comprises the part of the first reflective region covered with the color resistance and the second reflective region, and the reflective dark region comprises the part of the first reflective region provided with the light shielding layer.

11. The transflective and non-rectangular display panel according to claim 9, wherein
in each of the sub pixels in each of the abnormal pixels, the other part of the second reflective region is provided with the light shielding layer, wherein the reflective light region comprises the part of the first reflective region covered with the color resistance and the white light reflective light-emitting region, and the reflective dark region comprises the part of the first reflective region provided with the light shielding layer and the part of the second reflective region provided with the light shielding layer.

12. The transflective and non-rectangular display panel according to claim 6, wherein
the color resistance layer comprises three colors of color resistances comprising a red color resistance, a green color resistance and a blue color resistance, and
areas of the blue color resistance, the red color resistance and the green color resistance in each of the plurality of pixels are decreased sequentially.

13. A display device, comprising:
a transflective and non-rectangular display panel, wherein the transflective and non-rectangular display panel comprises:
a display region;
a non-display region surrounding the display region, wherein there is a first boundary between the display region and the non-display region, and a region surrounded by the first boundary and the display region is non-rectangular;
a plurality of pixels comprising a plurality of sub pixels, wherein each of the plurality of pixels comprises at least three of the plurality of sub pixels, and an open region of each of the plurality of sub pixels has a transmissive region and a reflective region, the plurality of pixels comprises normal pixels in the display region and abnormal pixels passed through by the first boundary, wherein in each of the sub pixels of each of the abnormal pixels, the transmissive region comprises a transmissive dark region and a transmissive light region, and the reflective region comprises a reflective dark region and a reflective light region; and
a light shielding layer, wherein the transmissive dark region and the reflective dark region are provided with the light shielding layer, and the transmissive light region and the reflective light region are not provided with the light shielding layer.

* * * * *